US012426216B2

(12) United States Patent
Clemans

(10) Patent No.: US 12,426,216 B2
(45) Date of Patent: Sep. 23, 2025

(54) THERMAL MANAGEMENT OF A VEHICLE COMPUTING SYSTEM

(71) Applicant: PACCAR Inc, Bellevue, WA (US)

(72) Inventor: Jason Clemans, Paradise, TX (US)

(73) Assignee: PACCAR Inc, Bellevue, WA (US)

(*) Notice: Subject to any disclaimer, the term of this patent is extended or adjusted under 35 U.S.C. 154(b) by 224 days.

(21) Appl. No.: 18/122,425

(22) Filed: Mar. 16, 2023

(65) Prior Publication Data
US 2024/0314983 A1  Sep. 19, 2024

(51) Int. Cl.
B60H 1/00 (2006.01)
H05K 7/20 (2006.01)

(52) U.S. Cl.
CPC ..... H05K 7/20845 (2013.01); B60H 1/00271 (2013.01); B60H 1/00878 (2013.01)

(58) Field of Classification Search
CPC ............ H05K 7/02845; B60H 1/00878; B60H 1/00271
See application file for complete search history.

(56) References Cited

U.S. PATENT DOCUMENTS

| 2009/0180250 A1 | 7/2009 | Holling et al. |
| 2020/0238787 A1 | 7/2020 | Awad Alla et al. |
| 2020/0376926 A1 | 12/2020 | Nishiyama et al. |
| 2021/0162835 A1 | 6/2021 | Hyatt |

OTHER PUBLICATIONS

Extended European Search Report for European Patent Application No. 24157431.8 mailed Aug. 28, 2024, 11 pages.
YouTube Video—https://www.youtube.com/watch?v=ybkBQogCdKQ—Phase Change Material (PCM) Heat Sinks: Fundamentals of Operation and Real World Applications. Advanced Cooling Technologies Inc. Uploaded to YouTube on Mar. 23, 2016.

Primary Examiner — Nael N Babaa

(57) ABSTRACT

Computer thermal regulation (CTR) systems and methods for thermal energy (TE) regulation of vehicle computers designed to operate within a target temperature range (TTR). A vehicle HVAC system includes a computer heat exchanger in the computer including a phase change material (PCM) with a phase change temperature (PCT). When the computer is below a TTR lower limit, the CTR system causes the HVAC system to run a heating cycle, heating the PCM to and above the PCT. The PCM releases stored TE to the computer. When the CTR system is above a TTR upper limit, the CTR system causes the HVAC system to run a cooling cycle, cooling the PCM to and below the TTR. The PCM then absorbs heat from the computer. TE storage and release processes during phase changes enable the PCM to operate as a buffer between the HVAC system and the computer to allow finer control over the computer temperature with an otherwise over-powered HVAC system for the vehicle.

14 Claims, 7 Drawing Sheets

THERMAL MANAGEMENT OF A VEHICLE COMPUTING SYSTEM

BACKGROUND

Vehicle computers, such as autonomous driving computers, are increasingly being implemented into vehicles on the road that allow the vehicles to perform partial to fully automated driving tasks/actions, such as cruise control, lane keeping, impact collision warning/avoidance, safety-critical functions, self-driving functions, etc. Vehicle computers can be large in size and may generate a significant amount of heat as a byproduct of performing autonomous driving computations. Moreover, the vehicle computer may include temperature sensitive components designed to operate reliably within a target temperature range. For example, outside the target temperature range, components of the vehicle computer may not operate optimally or may potentially fail.

While relatively specific examples have been discussed, it should be understood that aspects of the present disclosure should not be limited to solving the specific examples identified in the background.

SUMMARY

The disclosure generally relates to providing thermal management of temperature-sensitive vehicle electronics of a vehicle computer, such as an autonomous driving computer according to examples. According to an example implementation, a computer thermal regulation system may include a vehicle heating and cooling system comprising a computer heat exchanger. The computer heat exchanger may be located in the vehicle computer and may include a phase change material (PCM) with a temperature range between its solid and liquid phases corresponding to a target temperature range of the vehicle computer. When the vehicle computer is below a lower limit corresponding to the target temperature range, the computer thermal regulation system may cause the vehicle heating and cooling system to run a heating cycle to heat the PCM, releasing stored heat to the vehicle computer. When the computer thermal regulation system is above an upper of the limit target temperature range, the computer thermal regulation system may cause the vehicle heating and cooling system to run a cooling cycle to cool the PCM, allowing the PCM to absorb heat from the vehicle computer. Thermal energy storage and release processes during phase changes enable the PCM to operate as a buffer between the vehicle heating and cooling system and temperature-sensitive components of the vehicle computer.

According to an example implementation, a method is described, comprising: receiving a first temperature measurement associated with a vehicle computer, wherein the vehicle computer has a target temperature range; determining whether the first temperature measurement is within an upper and a lower limit of the target temperature range; when a determination is made that the first temperature measurement is below the lower limit, causing a heating and cooling system of the vehicle to run a heating cycle, wherein: the heating and cooling system includes a computer heat exchanger in heat exchange communication with a phase change material (PCM) located in the vehicle computer; and running the heating cycle causes the computer heat exchanger to heat the PCM to and then above a phase change temperature of the PCM; and when a determination is made that the first temperature measurement is above the upper limit, causing the heating and cooling system of the vehicle to run a cooling cycle, wherein running the cooling cycle causes the computer heat exchanger to cool the PCM to and below the phase change temperature of the PCM.

According to another example implementation, a system is described, comprising: at least one processor; and a memory including instructions, which when executed by the processor, cause the system to: receive a first temperature measurement associated with a vehicle computer, wherein the vehicle computer has a target temperature range; determine whether the first temperature measurement is within an upper and a lower limit of the target temperature range; when a determination is made that the first temperature measurement is below the lower limit, cause a heating and cooling system of the vehicle to run a heating cycle, wherein: the heating and cooling system includes a computer heat exchanger in heat exchange communication with a phase change material (PCM) located in the vehicle computer; and running the heating cycle causes the computer heat exchanger to heat the PCM to and above a phase change temperature of the PCM; and when a determination is made that the first temperature measurement is above the upper limit, cause the heating and cooling system of the vehicle to run a cooling cycle, wherein running the cooling cycle causes the computer heat exchanger to cool the PCM to and below the phase change temperature of the PCM.

According to another example implementation, a vehicle is described, comprising: a vehicle computer, where the vehicle computer has a target temperature range; a heating and cooling system, comprising: a phase change material (PCM) in heat exchange communication with the vehicle computer and having a phase change temperature that is correlated to the target temperature range; and a computer heat exchanger in heat exchange communication with the PCM; at least one processor; and a memory including instructions, which when executed by the processor, cause the autonomous vehicle to: receive a first temperature measurement associated with the vehicle computer; determine whether the first temperature measurement is within an upper and a lower limit of the target temperature range; when a determination is made that the first temperature measurement is below the lower limit, cause a heating and cooling system to run a heating cycle, wherein running the heating cycle causes the computer heat exchanger to heat the PCM to and above the phase change temperature; and when a determination is made that the first temperature measurement is above the upper limit, cause the heating and cooling system of the vehicle to run a cooling cycle, wherein running the cooling cycle causes the computer heat exchanger to cool the PCM to and below the phase change temperature.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following figures.

DETAILED DESCRIPTION

Figure 1:
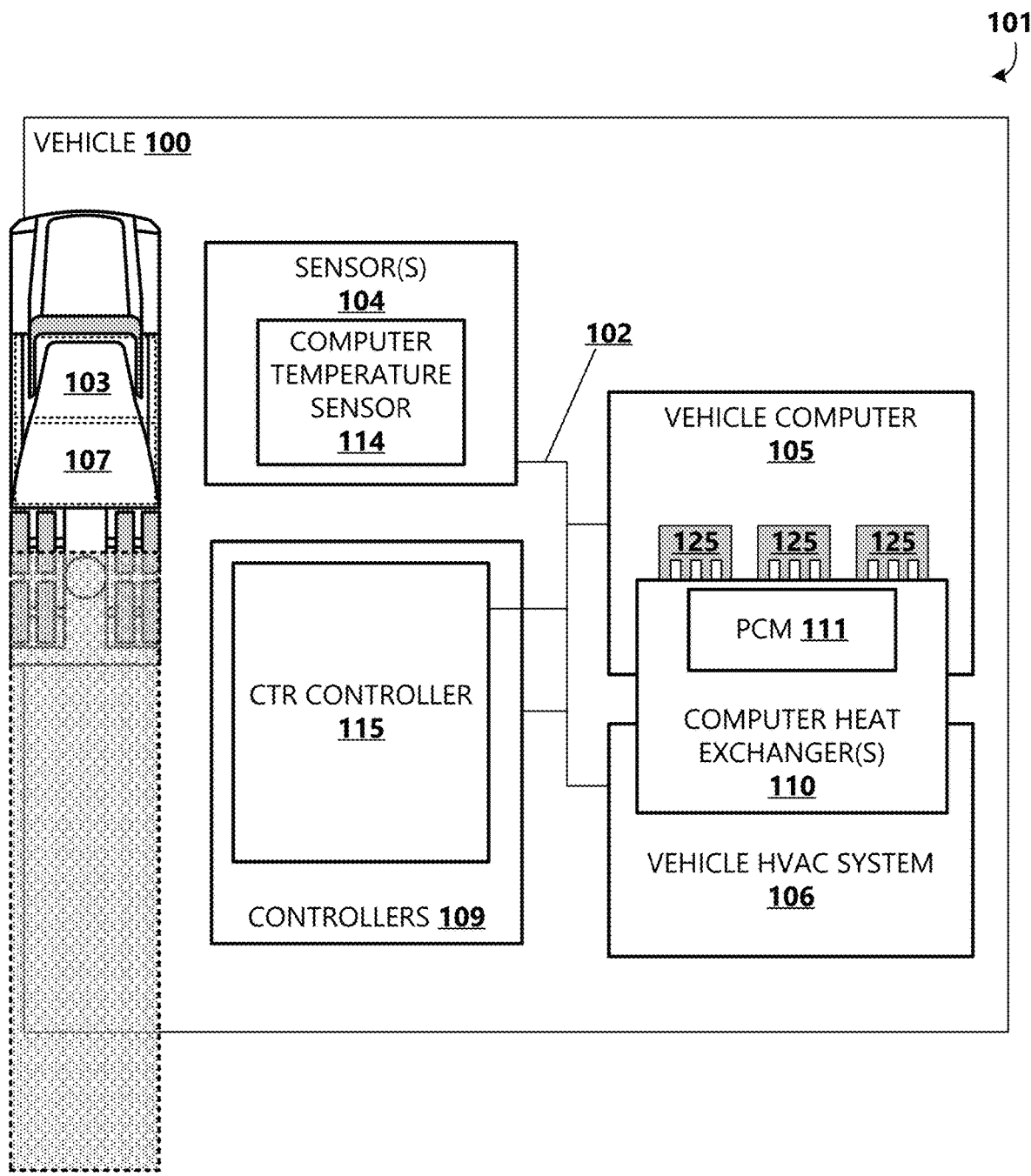
FIG. 1 is a block diagram illustrating an operating environment in which aspects of an electronics thermal regulation system may be implemented according to an example.

The following detailed description refers to the accompanying drawings. Wherever possible, the same reference numbers are used in the drawings and the following description to refer to the same or similar elements. While aspects of the present disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the present disclosure, but instead, the proper scope of the present disclosure is defined by the appended claims. The following detailed description is, therefore, not to be taken in a limiting sense.

As mentioned above, a vehicle computer, such as an autonomous driving computer, may include temperature sensitive components designed to operate reliably within a target temperature range. Additionally, as a byproduct of performing autonomous driving computations, the vehicle computer may generate a significant amount of heat. According to examples, it may be desirable to use an existing heating and cooling (HVAC) system in the vehicle to heat and cool the vehicle computer, rather than to add a separate heating and/or cooling system for the vehicle computer. For instance, the existing HVAC system may be the system used to heat and cool a cab and/or sleeping compartment of the vehicle. Such existing HVAC systems, however, may be overly powerful for the thermal management of the vehicle computer. For example, the vehicle HVAC system may be designed to output approximately ten times an amount of heating and/or cooling power needed to regulate the target temperature range of the vehicle computer. Additionally, the temperature at which the vehicle HVAC system operates may be variable based on various factors, such as a solar load coming into the vehicle, atmospheric temperature, engine speed, etc. Thus, using an overpowered vehicle heating and cooling system to regulate the vehicle computer target temperature range may overheat and/or overcool the vehicle computer. For instance, when the temperature of the vehicle computer becomes too hot, the vehicle computer may malfunction or shut down, and internal components of the computer may be damaged, etc. Additionally, when the temperature of the vehicle computer becomes too cold, condensation may form, which may cause damage to internal components of the vehicle computer.

Accordingly, systems and methods are described for providing thermal management of a vehicle computer, such as an autonomous driving computer including various temperature-sensitive electronic components. According to examples, a vehicle computer thermal regulation system may include a vehicle heating and cooling system comprising a computer heat exchanger. The computer heat exchanger may be located within a housing of the vehicle computer and may include a phase change material (PCM) that stores thermal energy while changing from solid to liquid phase and releases heat while changing from liquid to solid phase. For instance, the phase change temperature (e.g., melting point) of the PCM may be selected to correspond to a target temperature range of the vehicle computer. When the vehicle computer is below a lower limit corresponding to the target temperature range, the computer thermal regulation system may cause the vehicle heating and cooling system to run a heating cycle to heat the PCM, releasing thermal energy to the vehicle computer. When the computer thermal regulation system is above an upper of the limit target temperature range, the computer thermal regulation system may cause the vehicle heating and cooling system to run a cooling cycle to cool the PCM, allowing the PCM to absorb heat from the vehicle computer. Thermal energy storage and release processes during phase changes enable the PCM to operate as a buffer between the vehicle heating and cooling system and temperature-sensitive components of the vehicle computer and allow for fine-tuned control of vehicle-computer temperature using an otherwise over-powered HVAC system. These and other examples are discussed below with reference to FIGS. 1-7.

FIG. 1 is a block diagram illustrating an example computer thermal regulation (CTR) system 101 for a vehicle 100. With reference now to FIG. 1, the vehicle CTR system 101 includes a vehicle 100. In some examples, and as depicted in various Figures, the vehicle 100 is a truck, such as Class 8 truck. For instance, the vehicle 100 may include a cab 103 compartment and a sleeper 107 compartment attached to the cab 103. However, the methods and systems can be used by various types of vehicles of all sizes. It will be appreciated that aspects of the disclosed subject matter may also have wide application and, therefore, may be suitable for use with any type of vehicle, such as passenger vehicles, motorcycles, buses, light, medium, and heavy-duty vehicles, trains, boats, yachts, motor homes, etc. Accordingly, the following descriptions and illustrations herein should be considered illustrative in nature and, thus, not limiting the scope of the claimed subject matter.

According to an example implementation, the vehicle 100 may include sensors 104, one or more controllers 109, a vehicle computer 105, and a vehicle a heating and cooling (HVAC) system 106. The controllers 109 may contain logic for carrying out general or specific operational features of the vehicle 100. According to examples, the controllers 109 include an CTR controller 115 that may control the vehicle HVAC system 106 to run a cooling and/or heating cycles to cool and/or heat one or more temperature-sensitive components (e.g., the vehicle computer 105, components included in the vehicle computer 105) in the vehicle 100. The vehicle HVAC system 106 may be a main HVAC system of the vehicle, such as one used to heat and cool an interior of the vehicle (e.g., cab 103 and/or sleeper 107).

The vehicle HVAC system 106 may include one or systems for heating and cooling the passenger compartment (e.g., cab 103 and/or sleeper 107) of the vehicle 100. For instance, a single HVAC system 106 may include a heat pump or refrigeration system that can switch between heating and cooling cycles. In other examples, the vehicle HVAC system 106 may include a heating system that may include a heater core and that uses engine coolant to transfer heat to the cab 103 and/or sleeper 107. The vehicle HVAC system 106 may further include a separate cooling system that cycles refrigerant to cool air blown into the passenger compartment. In some examples, only one system (e.g., either heating or cooling) may run at a time to regulate the passenger compartment temperature. In other examples, both the heating and cooling systems can run simultaneously. For instance, hot and cold air can be mixed or diverted to different zones in the vehicle 100. The vehicle HVAC system 106 may include various air mix dampers, air directional dampers, or diverters, operatively and/or fluidly connected to direct airflow.

According to examples, the vehicle HVAC system 106 may include one or more heat exchangers, where the heat exchanger(s) may include tubes through which the refrigerant or coolant flows. For instance, a cab/sleeper heat exchanger (sometimes referred to as an evaporator) may be used to heat or cool the temperature of air flowing into the passenger compartment via a blower that blows air through a casing surrounding the tubes of the evaporator, thus cooling or heating the air, which is blown into one or more zones of the passenger compartment.

Further, in some examples, one or more heat exchangers may be configured to heat and/or cool the vehicle computer 105. For instance, the vehicle HVAC system 106 may be used to heat and cool the vehicle computer 105 via one or more computer heat exchanger(s) 110 that are fluidly connected to other heat exchanger(s) in the HVAC system 106 that are used to heat and/or cool the interior of the vehicle. However, as mentioned above, the vehicle HVAC system 106 may be overpowered for thermal regulation of the vehicle computer 105, which, if used to heat or cool the vehicle computer 105 can cause undesired overheating or condensation of the vehicle computer 105. Accordingly, the computer heat exchanger(s) 110 include a phase change material (PCM) 111, where the PCM 111 may include one or a combination of PCM materials having a chemical composition and molecular structure designed to store and release heat during a phase change (i.e., from solid to liquid or from liquid to solid). Non-limiting examples of PCM materials include paraffin wax, salt hydrates, eutectic alloys, or other materials. The PCM 111 may absorb (store) heat from its surrounding environment as the PCM 111 changes state from solid to liquid and release heat into its environment as it changes state from liquid to solid.

According to examples, the PCM 111 may be of a type of PCM with thermal properties that cause the PCM 111 to have a phase change temperature that is correlated to the target temperature range of the vehicle computer 105. That is, the phase change temperature of the PCM is a temperature at which the PCM 111 undergoes a phase change from solid to liquid, or vice versa, during a thermal energy storage or release process. The phase change temperature may be within the target temperature range for the vehicle computer 105 or may be otherwise correlated to the target temperature range (e.g., a certain amount below the lower limit of the target temperature range). For instance, the thermal energy storage and release processes help the PCM 111 to operate as a buffer between the computer heat exchanger 110 and the vehicle computer and maintain the temperature range of the vehicle computer 105. Thus, the vehicle HVAC system 106 can be used to heat and cool both the vehicle interior and the vehicle computer 105.

In some examples, the CTR controller 115 may be a dedicated controller for the vehicle HVAC system 106. In other examples, the vehicle HVAC system 106 may additionally or alternatively be controlled by a vehicle HVAC controller included in the vehicle controllers 109 and in communication with the CTR controller 115. In other examples, the CTR controller 115 and/or the vehicle HVAC controller may be incorporated in a general-purpose controller (e.g., a vehicle system controller (VSC) or an engine control unit (ECU)), or another controller 109. Controllers 109 may include braking, steering, powertrain controllers, and/or other controllers etc. According to examples, the CTR controller 115 and other controllers 109 may collect data from various sensors 104, process the collected data, and send control signals to various systems. According to examples, the controllers 109, sensors 104, vehicle computer 105, and vehicle HVAC system 106 communicate wired or wireless link, and/or indirectly through a vehicle-wide network 102, where the CAN 112 may be implemented using any number of different communication protocols.

According to examples, the vehicle 100 may include various types of vehicle system sensors 104 operative to sense or detect data relating to the vehicle and/or the vehicle environment. Examples of sensors 104 may include, but are not limited to, brake sensors, a throttle sensor, an accelerator pedal position sensor, tire pressure sensors, vehicle inertial sensor(s), fuel flow sensors, fuel tank level sensors, wheel speed sensors, an engine speed sensor, a vehicle speed sensor, a transmission gear sensor, temperature sensors, humidity sensors, accelerometers, vehicle passenger load and/or payload sensors, etc. According to examples, the sensors 104 may further include various sensors for collecting and sending data to the vehicle computer 105, such as one or a combination of LiDAR (Light Detection and Ranging), cameras, radar, ultrasonic sensors, a GPS, and an IMU (Inertial Measurement Unit). According to examples, the sensors 104 may further include a computer temperature sensor 114 operative to obtain a current temperature measurement corresponding to the vehicle computer 105 and send the current temperature measurement to the CTR controller 115. The above sensors 104 may be used individually or in conjunction with each other.

According to example, the vehicle computer 105 includes at least one processor 125 and a memory including instructions, which when executed by the at least one processor 125, cause the vehicle computer 105 to provide one or more autonomous vehicle functionalities to the vehicle 100. Non-limiting examples of autonomous driving functionalities include cruise control, lane keeping, impact collision warning/avoidance, safety-critical functions, self-driving functions, etc. For example, the vehicle 100 may be an autonomous vehicle having a level of automation between partial and full automation. In some examples, the vehicle computer 105 processes sensor data to monitor the operating environment, perceive condition(s) of the environment, and determine one or more automated driving tasks/actions to perform based on the condition(s). In some examples, the vehicle computer 105 uses rules, obstacle avoidance algorithms, predictive modeling, object recognition, and other technologies to perceive conditions and to determine a corresponding automated driving tasks/action(s) to perform. Example automated driving tasks/action(s) may include one or a combination of brake control, throttle control, steering control, suspension control, transmission control, other chassis control, drive state control, lighting and horn control, etc. According to examples, the vehicle computer 105 may output control signals or other instructions to one or more vehicle system controllers 109 to cause one or more vehicle systems to perform the determined automated driving action(s). According to examples, various components of the vehicle computer 105 may be sensitive to variations in temperature, humidity, and/or other environmental factors.

For instance, the one or more processors 125 of the vehicle computer 105 may be temperature sensitive and designed to operate reliably within a target temperature range (e.g., between 40° C. and 45° C.), where outside the target temperature range, components of the vehicle computer 105 may not perform optimally and/or may potentially degrade or fail. Additionally, the vehicle computer may generate a continuous heat output (e.g., 1500 W) during operation.

The computer temperature sensors 114 may measure a temperature corresponding to the vehicle computer 105. In some examples, the computer temperature sensor 114 is included in the vehicle computer 105 (e.g., proximate the processor(s) 125). In other examples, the computer temperature sensor 114 is included in or is in contact with the PCM 111. The computer temperature measurement may be transmitted to the CTR controller 115. In some examples, the computer temperature sensor 114 is configured to measure a current temperature and transmit the current temperature measurement to the CTR controller 115 according to a predetermined frequency (e.g., once per 1-N seconds, once per 1-N minutes).

Figure 2:
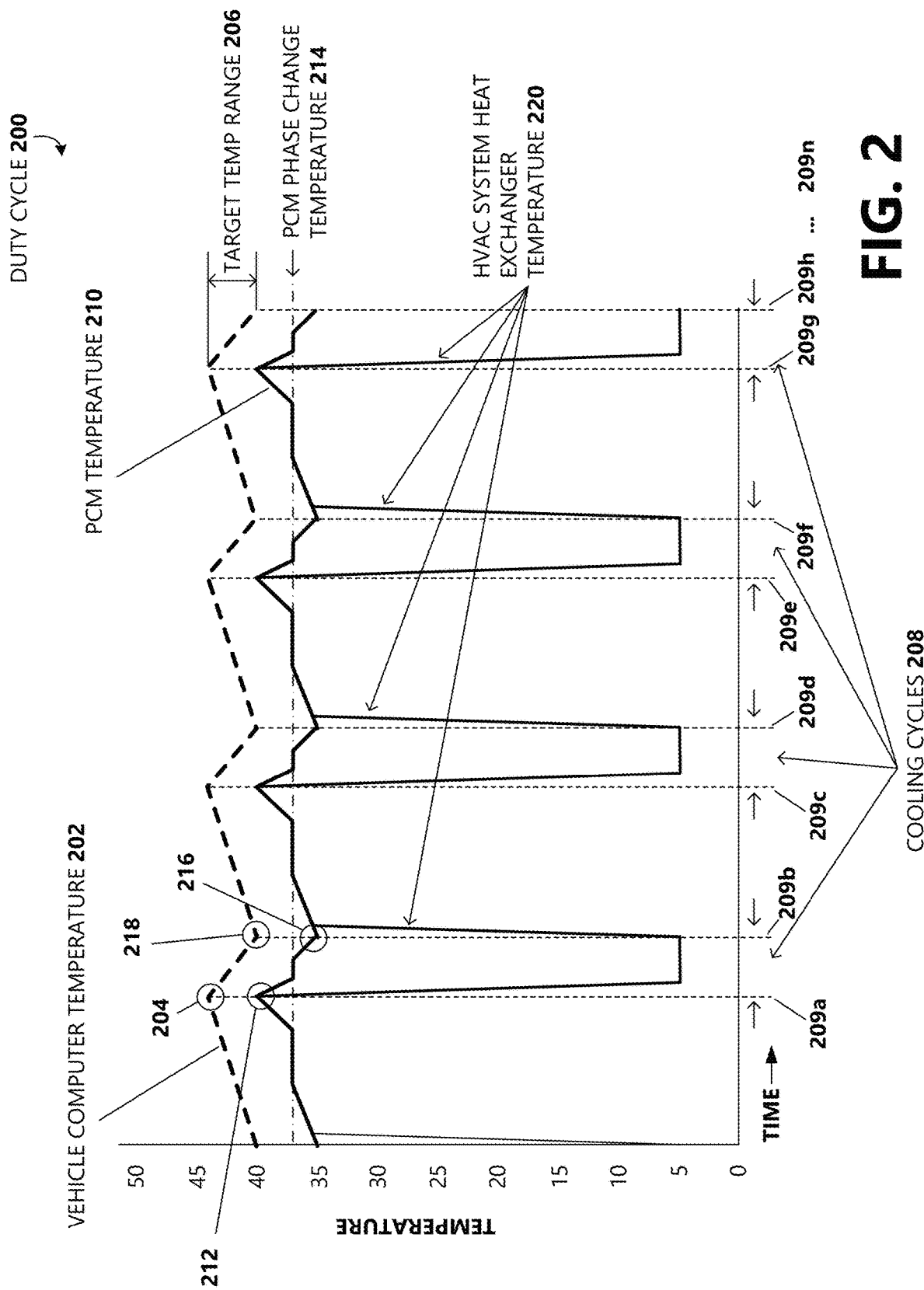
FIG. 2 depicts a duty cycle of a heating and cooling system of the vehicle to maintain a target temperature range of a vehicle computer according to an example.

According to examples, the CTR controller 115 may receive and use computer temperature measurements to determine whether to operate the vehicle HVAC system 106 to heat or cool the vehicle computer 105. For instance, the CTR controller 115 may cause the vehicle HVAC system 106 to operate in a duty cycle to maintain the target temperature range of the vehicle computer 105. With reference now to FIG. 2, an example duty cycle 200 is depicted. In some examples, the CTR controller 115 may determine whether the received temperature measurement(s) 209a-n (collectively, temperature measurement(s) 209) indicate cooling is needed to maintain the target temperature range 206 of the vehicle computer 105. According to an example, the target temperature range 206 may range between 40° C. and 45° C. For instance, when a determination is made that cooling is needed, the CTR controller 115 may determine to run the vehicle HVAC system 106 for a cooling cycle 208.

In some examples, the received temperature measurement(s) 209 include a measurement of the vehicle computer temperature 202. For instance, a determination may be made as to whether a first example temperature measurement 209a indicates the vehicle computer temperature 202 is within an upper temperature limit 204 and a lower temperature limit 218 corresponding to the target temperature range 206 of the vehicle computer 105. In some examples, in response to determining the vehicle computer temperature 202 received from the computer temperature sensor 114 is at, approaching, or above the upper temperature limit 204, the CTR controller 115 may determine to run the vehicle HVAC system 106 for a cooling cycle 208.

In other examples, the received temperature measurement(s) 209 include a measurement of the PCM 211. For instance, a determination may be made as to whether the PCM temperature 210 is at, approaching, or above an upper temperature limit 212 of the PCM 111. According to an example and as depicted, the PCM's phase change temperature 214 may be approximately 37.5° C., although other phase change temperatures are possible and contemplated. In some examples, in response to determining the measurement of the PCM temperature 210 received from the computer temperature sensor 114 is at, approaching, or above the upper temperature limit 212, the CTR controller 115 may determine to run the vehicle HVAC system 106 for a cooling cycle 208.

According to examples, running the cooling cycle 208 causes the vehicle HVAC system 106 to absorb heat from the PCM 111 and cool the PCM temperature 210 to a temperature at or below the PCM's phase change temperature 214. For instance, the PCM 111 will cool, then solidify at its phase change temperature 214, and then cool some more. As the PCM 111 cools, solidifies, and cools some more, heat is released by the PCM 111 and absorbed by the refrigerant that is circulated through the HVAC system 106. In some examples, when operating in a cooling cycle 208, the vehicle HVAC system 106 may quickly cool the refrigerant (as shown in the HVAC system heat exchanger temperature range 220) from approximately 40° C. to approximately 5° C. As depicted, heat generated by the vehicle computer 105 may be absorbed by the cooling PCM 111, decreasing the vehicle computer temperature 202. For instance, during a cooling cycle 208, the HVAC system 106 and PCM 111 may actively heat sink the vehicle computer 105 so that the vehicle computer temperature 202 does not exceed the upper temperature limit 204 of the target temperature range 206.

In some examples, the CTR controller 115 may continue to receive measurements of the vehicle computer temperature 202 and/or PCM temperature 210. For instance, during the cooling cycle 208, the CTR controller 115 may receive a second example temperature measurement 209b and determine the vehicle computer temperature 202 is at or approaching the lower temperature limit 218 of the target temperature range 206 and/or the PCM temperature 210 is at or approaching a lower temperature limit 216. In response, the CTR controller 115 may cause the vehicle HVAC system 106 to end the cooling cycle 208. For instance, the vehicle HVAC system 106 may operate in a cooling cycle 208 for a period of time (e.g., 30 seconds, 1 minute) until it may be instructed to end the cooling cycle 208 by the CTR controller 115.

When the cooling cycle 208 ends, heat generated by the vehicle computer 105 may continue to be absorbed by the PCM 111 to cool the vehicle computer 105. For instance, this may cause the PCM temperature 210 to increase at an unconstrained rate until it reaches its phase change temperature 214. The PCM 111 then continues to absorb heat from the vehicle computer 105, but uses that heat to change phase from solid to liquid, while the PCM 111 maintains at the phase change temperature 214. Once the phase change is complete, the PCM temperature continues to rise until again the maximum temperature 204/212 is reached, and the cycle starts again. The PCM 111 is able to absorb or release a relatively large amount of latent heat in a narrow temperature range, and thus, regulate the vehicle computer temperature 202 for a longer duty cycle of the HVAC system than would otherwise be possible. That is, the PCM 111 can be cooled with a cooling cycle of relatively high power (e.g., 5 degree HVAC fluid temperature) without overcooling the vehicle computer 105 (since the temperature drop of the PCM is slowed by cooling the PCM to, through, and beyond a phase change). Also, because the phase change material is cooled through a phase change during the cooling cycle, when the cooling cycle ends and the vehicle computer 105 continues to emit heat, the phase change material can continue to absorb heat for a longer period of time (e.g., between 209b and 209c) than would be possible if a non-PCM insulator were used. In some examples, the CTR controller 115 may receive a third example temperature measurement 209c of the vehicle computer temperature 202 and/or the PCM temperature 210 that triggers the CTR controller 115 to run another cooling cycle 208. According to examples, the PCM 111 may operate as a buffer between the mismatched cooling power of the vehicle HVAC system 106 (e.g., HVAC system heat exchanger (fluid) temperature range 220 between approximately 5° C. and 40° C.) and the more sensitive target temperature range 206 (e.g., 40° C.-45° C.) of the vehicle computer 105. For instance, the PCM 111 may prevent overcooling of the vehicle computer 105 by the vehicle HVAC system 106, and thus prevent condensation.

In further examples, the CTR controller 115 may determine whether the received temperature measurement(s) indicate heating is needed to bring the vehicle computer temperature 202 into the target temperature range 206. When a determination is made that heating is needed, the CTR controller 115 may determine to run the vehicle HVAC system 106 for a heating cycle (not pictured). For instance, the CTR controller 115 may cause the vehicle HVAC system 106 to run a heating cycle in response to determining the vehicle computer temperature 202 is at, approaching, or below the lower temperature limit 218 of the target temperature range 206 and/or the PCM 111 is at, approaching, or below the PCM's lower temperature limit 216. For instance, the received temperature measurement(s) may be below the lower temperature limits when the vehicle 100 is cold soaked or has otherwise been parked for a period of time in a very cold environment, such as outside in freezing temperatures.

According to examples, running the heating cycle causes the vehicle HVAC system 106 to heat the PCM 111. The PCM may start at a temperature below the PCM phase change temperature 214, then absorb heat without changing temperature while a phase change from solid to liquid occurs, and then begin to heat again to a temperature above its phase change temperature 214. In some examples, when operating in a heating cycle, the vehicle HVAC system 106 may output fluid in an HVAC system heat exchanger temperature range 220 between approximately 40° C. and 100° C.

In some examples, the CTR controller 115 may continue to receive measurements of the vehicle computer temperature 202 and/or PCM temperature 210. For instance, during the heating cycle, the CTR controller 115 may receive a subsequent temperature measurement and determine the vehicle computer temperature 202 is above or approaching the upper temperature limit 204 of the target temperature range 206 and/or the PCM temperature 210 is above or approaching the PCM's upper temperature limit 212. In response, the CTR controller 115 may cause the vehicle HVAC system 106 to end the heating cycle. For instance, the vehicle HVAC system 106 may operate in a heating cycle for a period of time (e.g., 30 seconds, 1 minute) until the CTR controller 115 causes the heating cycle to end. When the heating cycle ends, heat stored by the PCM 111 may continue to be transferred to the vehicle computer 105 to heat it to within the target temperature range 206. This may continue until the CTR controller 115 determines to run another heating cycle or to switch to a cooling cycle 208. For instance, the CTR controller 115 may cause the vehicle HVAC system 106 to switch between a heating cycle and a cooling cycle maintain the target temperature range 206 of the vehicle computer 105. For instance, the CTR controller 115 may use the vehicle HVAC system 106 and PCM 111 to provide heating when needed and prevent overheating of the vehicle computer 105.

Figure 3:
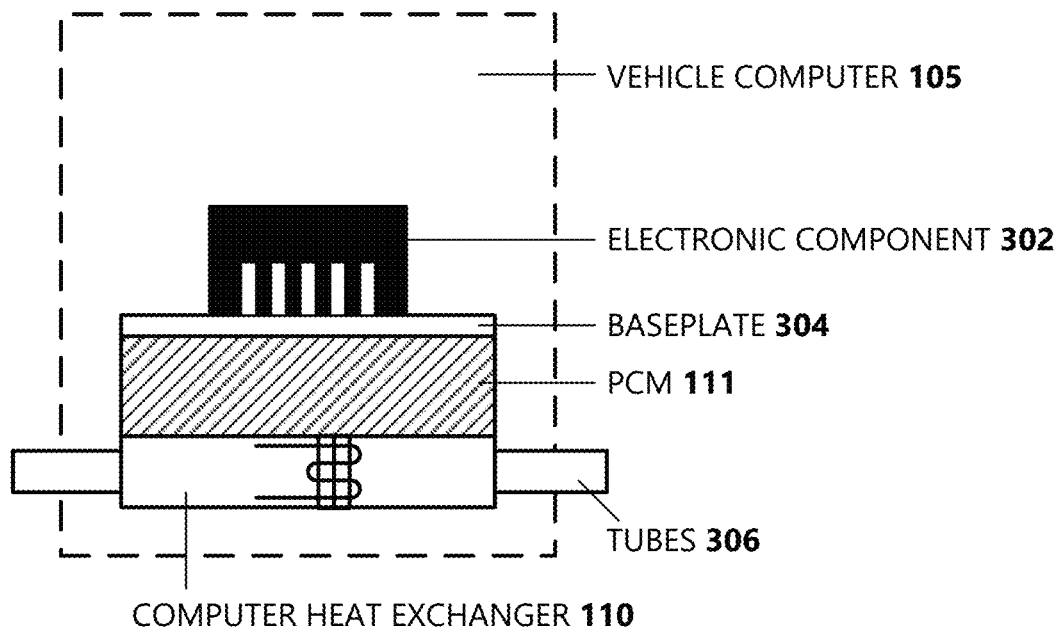
FIG. 3 is an illustration of a heat exchanger included in a vehicle computer according to an example.

FIG. 3 is an illustration of a computer heat exchanger 110 included in a vehicle computer 105 according to an example. As depicted, the vehicle computer 105 may include at least one temperature-sensitive electronic component 302 and a PCM 111 positioned between the electronic component(s) 302 and the computer heat exchanger 110. For instance, the electronic component 302 may include a processor or processing chip that may need to be heated and/or cooled to maintain a target temperature range 206 prior to and/or during operation of the vehicle computer 105. As an example, the electronic component 302 may have a target temperature of 40° C. that cannot exceed an upper temperature limit of 45° C. In some examples, the electronic component 302 cannot drop below ambient dew point. Further as depicted, a surface of the electronic component 302 may be in contact with a surface of a baseplate 304. For instance, the baseplate 304 may be a heat-dissipating baseplate on which the electronic component 302 may be mounted.

According to examples, another surface of the baseplate 304 may be in contact with the PCM 111. For instance, the PCM 111 may have a phase change temperature 214 corresponding to the target temperature range of the electronic component 302 (e.g., approximately 40° C.). In some examples, the PCM 111 may be attached to the baseplate 304. In other example, the PCM 111 may be attached to the computer heat exchanger 110.

Although a single computer heat exchanger 110 is shown in contact with the PCM 111 in FIG. 3, in other examples, a second computer heat exchanger 110 may be included in the vehicle HVAC system 106 and located in the vehicle computer 105. According to examples, the computer heat exchanger(s) 110 may include tubes 306 that carry refrigerant that is circulated through the heat exchanger 110 and through the rest of the system, allowing the computer heat exchanger 110 to cool the PCM 111 in contact with the electronic component 302. For instance, in a cooling or heating cycle, the PCM temperature 210 may be cooled or heated by the refrigerant or coolant. In some examples, the temperature of components of the computer heat exchanger(s) 110 may vary (e.g., between 5° C.-100° C.).

Figure 4:
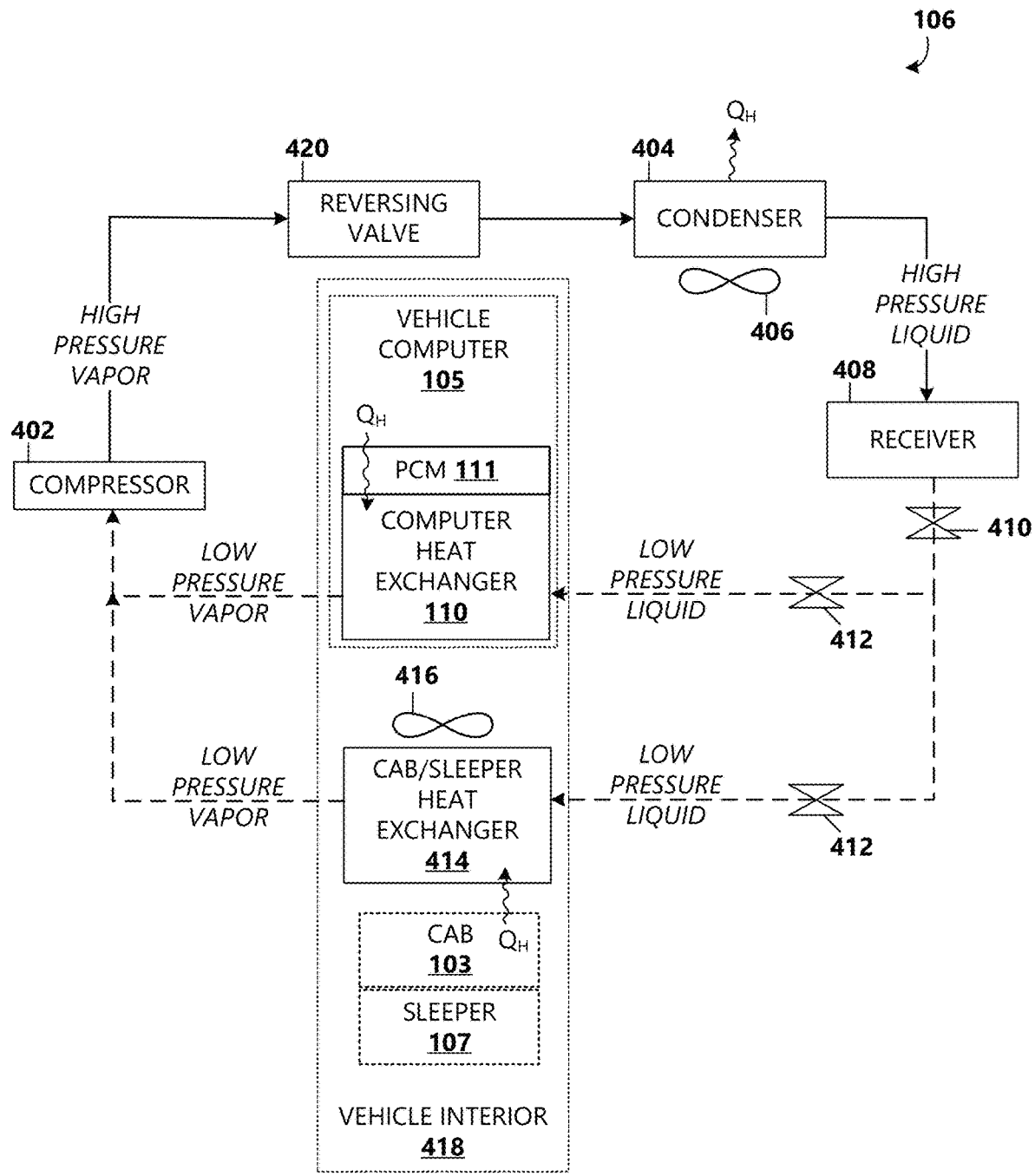
FIG. 4 is a schematic view of a vehicle heating and cooling system operating in a cooling cycle according to an example.

FIG. 4 is a schematic view of a cooling system 400 operating in a cooling cycle according to an example. For instance, the vehicle HVAC system 106 includes a computer heat exchanger 110 in accordance with examples of the present disclosure integrated with well-known components arranged in accordance with standard practices in the art of cooling system design and manufacture. With reference to the schematic in FIG. 4, in some examples, the cooling system 400 may include a compressor 402, a condenser 404, a receiver 408 an expansion valve 410, the computer heat exchanger 110, and a cab/sleeper heat exchanger 414.

During use, the compressor 402 may be driven by the engine of the vehicle 100 by any number of suitable methods, such as by a belt and pulley system. The compressor 402 compresses a refrigerant, producing a hot, high-pressure refrigerant at an outlet of the compressor 402. In some examples, the vehicle HVAC system 106 may be implemented as a heat pump including a reversing valve 420 that may be positioned to set the HVAC system 106 into one of a cooling mode and a heating mode. In other examples, the vehicle HVAC system 106 may include a separate heating system.

The hot gas refrigerant may be run through heat exchange coils of the condenser 404, dissipating heat and condensing into liquid refrigerant. The condenser 404 may be generally arranged such that relatively cool air (typically ambient air) is driven (such as by an engine cooling fan 406) over a set of heat exchange coils. In this regard, the condenser 404 may be generally located at the front end of the vehicle 100. As the cool air passes over the heat exchange coils, heat is removed from the refrigerant, causing the refrigerant to condense into a liquid, which is accumulated in a receiver 408. From the receiver 408, the expansion valve 118 may flash the liquid refrigerant into a low pressure, low temperature gas and/or liquid mixture.

In some examples, the vehicle HVAC system 106 further includes one or more evaporator valves 412 that may direct the flow of refrigerant through the computer heat exchanger 110, the cab/sleeper heat exchanger 414, and/or other heat exchangers that may be included in the vehicle HVAC system 106. In some examples, the computer heat exchanger 110 and the cab/sleeper heat exchanger 414 may be arranged in parallel. For instance, as depicted in FIG. 4, connecting the computer heat exchanger 110 and the cab/sleeper heat exchanger 414 in parallel may allow refrigerant to flow through each one independently. In other examples, the computer heat exchanger 110, the cab/sleeper heat exchanger 414, and/or other heat exchangers that may be included in the vehicle HVAC system 106 may be arranged in a series.

In some examples, the low pressure, low temperature refrigerant may be directed to the computer heat exchanger 110. For instance, the low pressure, low temperature refrigerant may circulate through tubes 306 disposed in heat exchange communication with the PCM 111 included in the vehicle computer 105, thereby causing heat to be transferred from the PCM 111 to the refrigerant. Such heat transfer cools the PCM 111 and heats the refrigerant, converting the refrigerant into a low pressure, hot gas. During this process, the PCM 111 may be cooled to its phase change temperature, solidify, and continue to be cooled. The PCM 111 may absorb heat from the vehicle computer 105, thus decreasing the vehicle computer temperature 202. The refrigerant, as a low pressure, hot gas, may be directed from an outlet of the computer heat exchanger 110 to an inlet of the compressor 402, where the cycle may start anew.

In other examples, an evaporator valve 412 may direct the flow of refrigerant through the cab/sleeper heat exchanger 414, where the low pressure, low temperature refrigerant may circulate through heat exchange coils in heat exchange communication with the interior 418 of the vehicle 100. For instance, a fan 416 may drive air over the heat exchange coils and into the cab 103 and/or sleeper 107 to cool the interior air of the vehicle 100. In that regard, as airflow from the fan 416 passes through the cab/sleeper heat exchanger 414, heat may be transferred from the air into the refrigerant, thereby heating the refrigerant and cooling the air. The cooled air may be directed into the cab 103 and/or sleeper 107. The refrigerant may be heated to a low pressure, hot gas, which may be directed from an outlet of the cab/sleeper evaporator 414 to the inlet of the compressor 402, where the cycle may start anew.

In some examples, the vehicle HVAC system 106 includes a single integrated cooling and heating system. For instance, the cooling system 400 described above can be operated in a heating cycle according to an example. In the heating cycle, the reversing valve 420 may connect output from the condenser 404 (e.g., low pressure vapor) to the compressor 402 and the output from the compressor 402 (e.g., high pressure vapor) to the computer heat exchanger 110 and/or cab/sleeper heat exchanger 414. For instance, as a result of this routing of the refrigerant, the condenser 404 may absorb heat from the environment. Conversely, the computer heat exchanger 110 may release heat from the incoming high pressure vapor to the PCM 111, heating the PCM 111 to its phase change temperature, liquifying the PCM 111, and continuing to heat the PCM 111 until the heating cycle is ended. For instance, thermal energy from the PCM 111 may be released as heat and absorbed by the vehicle computer 105 to warm the vehicle computer 105 to within its target temperature range 206. Additionally, the cab/sleeper heat exchanger 414 may release heat from the incoming high pressure vapor into the cab 103 and/or sleeper 107 via the fan 416.

Figure 5:
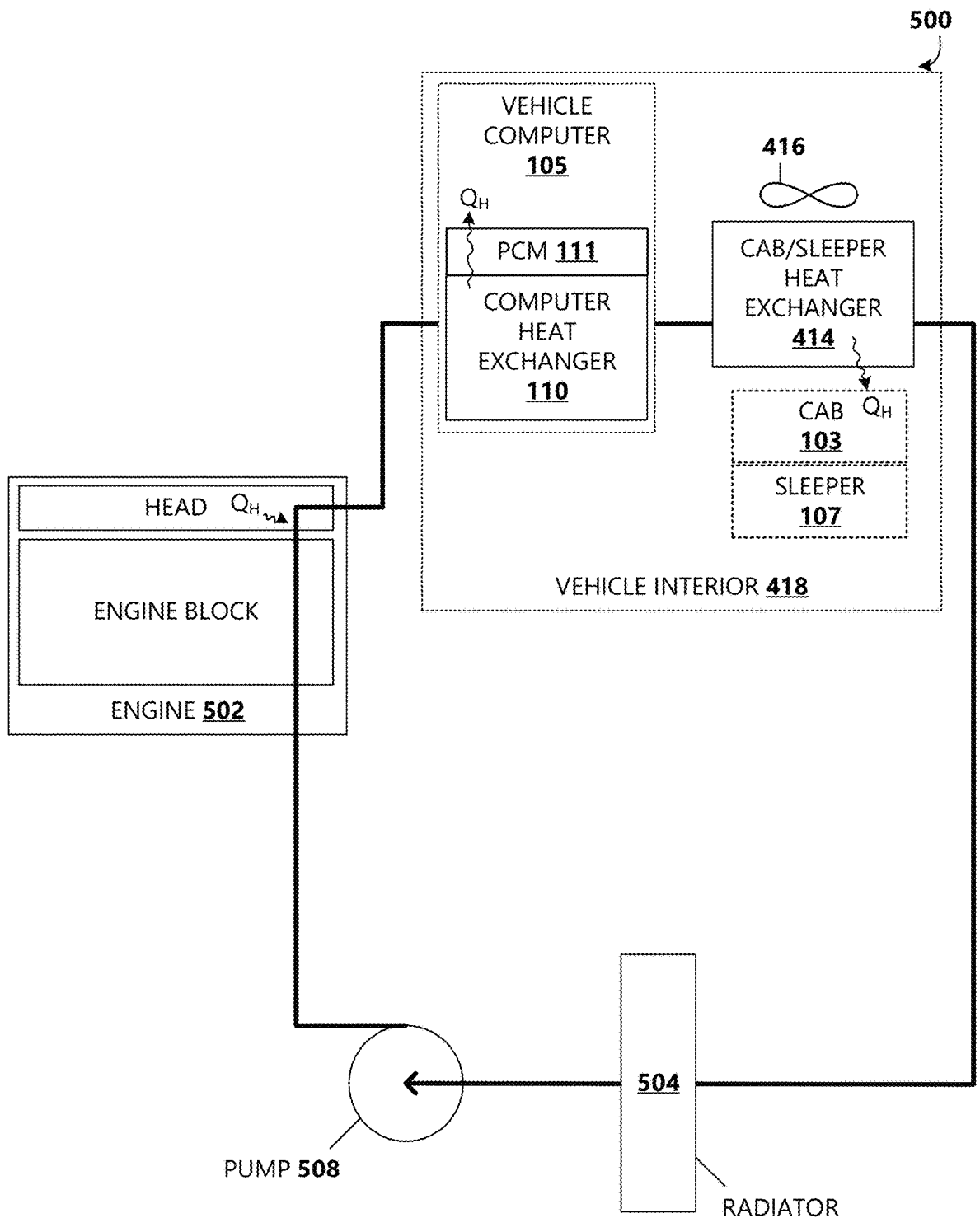
FIG. 5 is a schematic view of a vehicle heating and cooling system operating in a heating cycle according to an example.

In some examples, and as depicted in FIG. 5, the vehicle HVAC system 106 may include a separate heating system 500. According to an example, the heating system 500 may include the engine 502 or another heat source (e.g., a battery, a heater), a second computer heat exchanger 110 in accordance with examples of the present disclosure, a second cab/sleeper heat exchanger 414, a radiator 504, and a water pump 508 that may work to regulate temperatures of the vehicle computer 105, the cab 103, and/or the sleeper 107 of the vehicle 100. For instance, heat from the engine 502 and/or other heat sources may be absorbed by coolant carried by heater hoses from the engine 502 to the second computer heat exchanger 110 and/or second cab/sleeper heat exchanger 414. For instance, the absorbed heat may be transferred to the PCM 111 in the second computer heat exchanger 110 and/or directed into the cab 103 and/or sleeper 107 via a fan 416 in operative contact with the second cab/sleeper heat exchanger 414. For instance, the PCM 111 may be heated and eventually absorbed by the vehicle computer 105 to warm the vehicle computer 105 to within its target temperature range 206. Upon transferring heat into the vehicle 100, the coolant may be directed to the radiator 504, which may blow air across the hoses to cool it down and exchange the heat with the environment outside the vehicle 100. The coolant may then be returned to the water pump 508, where it may continue to circulate through the heating system 500.

Figure 6:
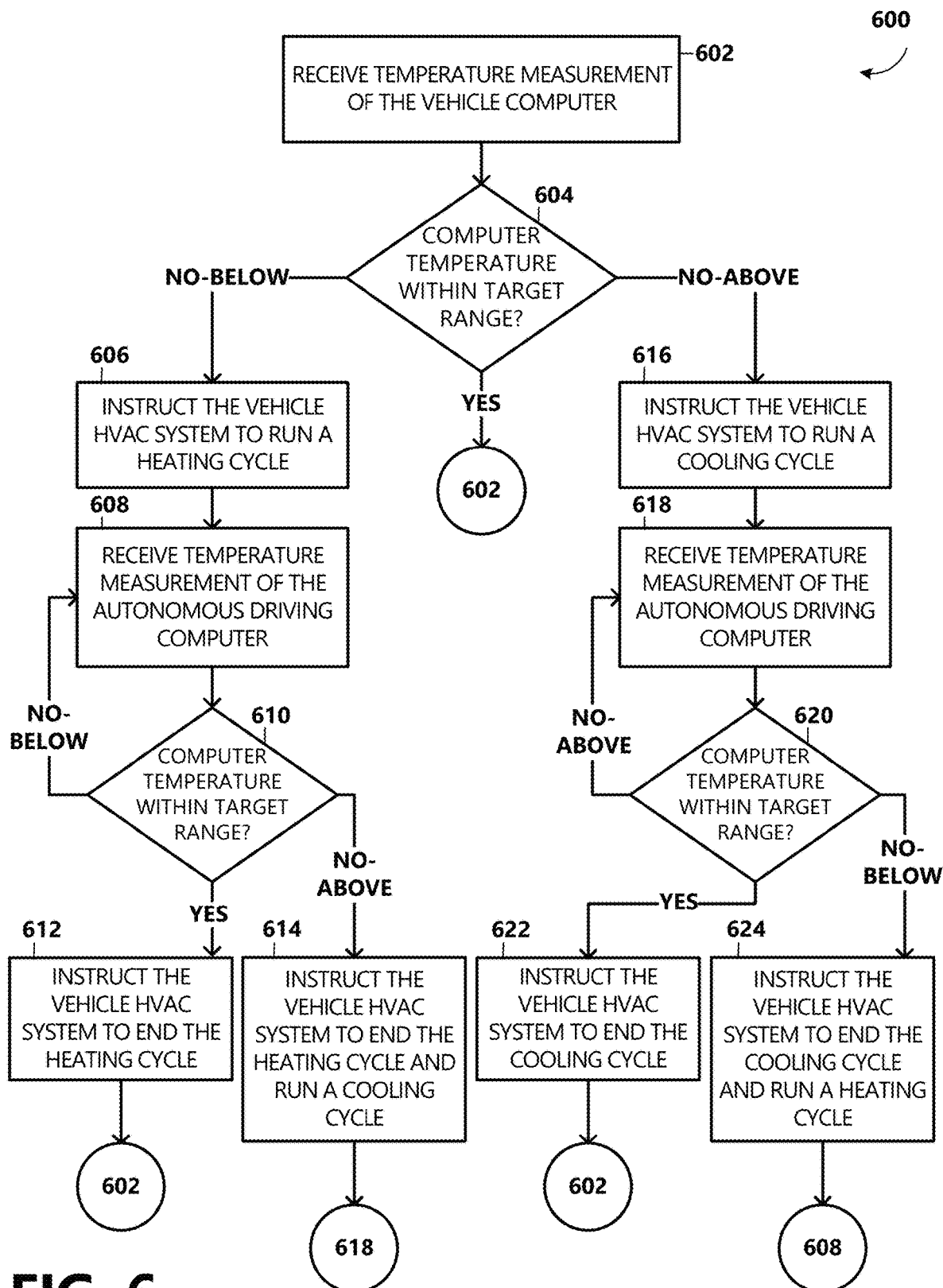
FIG. 6 is a flow diagram illustrating processing steps of a method that can be used to provide thermal management of a vehicle computer according to an example.

With reference now to FIG. 6, a flow diagram is provided illustrating example processing steps of a method 600 that can be used to provide thermal management of temperature-sensitive electronics 125 in a vehicle computer 105, according to examples. At operation 602, temperature measurements from one or more computer temperature sensors 114 may be received by the CTR controller 115. For instance, the received temperature measurement(s) may include a measurement of the vehicle computer temperature 202 and/or a measurement of the PCM 111 included in the computer heat exchanger 110.

At decision operation 604, a determination may be made as to whether the vehicle computer temperature 202 is within the target temperature range 206 and/or whether the PCM temperature 210 is within a PCM temperature range (e.g., between the lower limit 216 and the upper limit 212 of the PCM 111). In some examples, when a determination is made that the received temperature measurement is below the lower limit 218 of the target temperature range 206 or below the PCM's lower limit 216, at operation 606, the vehicle HVAC system 106 may be instructed to run a heating cycle. As described above, the heating cycle may direct heat to the PCM 111, which may release the heat to the vehicle computer 105 and increase the vehicle computer temperature 202.

At operation 608, additional temperature measurements may be received from one or more computer temperature sensors 114. For instance, the received temperature measurement(s) may include a measurement of the vehicle computer temperature 202 and/or a measurement of the PCM 111 included in the computer heat exchanger 110.

At decision operation 610, a determination may be made as to whether the vehicle computer temperature 202 is within the target temperature range 206 and/or whether the PCM temperature 210 is within the PCM temperature range. For instance, when a determination is made that the received temperature measurement is still below the lower limit, the heating cycle may continue to run to heat the PCM 111, and thus, the vehicle computer 105. The method 600 may return to operation 608, where additional temperature measurements may be received from one or more computer temperature sensors 114. In other examples, when a determination is made at decision operation 610 that the received temperature measurement is within the target temperature range, at operation 612, the vehicle HVAC system 106 may be instructed to end the heating cycle. The method 600 may return to operation 602, where additional temperature measurements may be received from one or more computer temperature sensors 114.

In further examples, when a determination is made at decision operation 610 that the received temperature measurement is above an upper limit, the method 600 may proceed to operation 614, where the vehicle HVAC system 106 may be instructed to end the heating cycle and run a cooling cycle. For instance, a determination may be made to absorb heat from the PCM 111 and vehicle computer 105. The method 600 may proceed to operation 618, where additional temperature measurements may be received from one or more computer temperature sensors 114.

Returning to decision operation 604, when a determination is made that the received temperature measurement is above an upper limit (e.g., of the target temperature range 206 or the PCM temperature range), at operation 616, the vehicle HVAC system 106 may be instructed to run a cooling cycle. As described above, the cooling cycle may redirect heat from the PCM 111 to refrigerant that is circulated through the HVAC system 106 to decrease the vehicle computer temperature 202.

At operation 618, additional temperature measurements may be received from one or more computer temperature sensors 114. For instance, the received temperature measurement(s) may include a measurement of the vehicle computer temperature 202 and/or a measurement of the PCM 111 included in the computer heat exchanger 110.

At decision operation 620, a determination may be made as to whether the vehicle computer temperature 202 is within the target temperature range 206 and/or whether the PCM temperature 210 is within the PCM temperature range. For instance, when a determination is made that the received temperature measurement is still above an upper limit, the cooling cycle may continue to run to absorb heat from the PCM 111, and thus, the vehicle computer 105. The method 600 may return to operation 618, where additional temperature measurements may be received from one or more computer temperature sensors 114. In other examples, when a determination is made at decision operation 620 that the received temperature measurement is within the target temperature range, at operation 622, the vehicle HVAC system 106 may be instructed to end the cooling cycle. The method 600 may return to operation 602, where additional temperature measurements may be received from one or more computer temperature sensors 114.

In further examples, when a determination is made at decision operation 620 that the received temperature measurement is below the lower limit, the method 600 may proceed to operation 624, where the vehicle HVAC system 106 may be instructed to end the cooling cycle and run a heating cycle. For instance, a determination may be made to heat the PCM 111 and vehicle computer 105. The method 600 may proceed to operation 608, where additional temperature measurements may be received from one or more computer temperature sensors 114. The method 600 may continue while the vehicle computer 105 is in operation.

Figure 7:
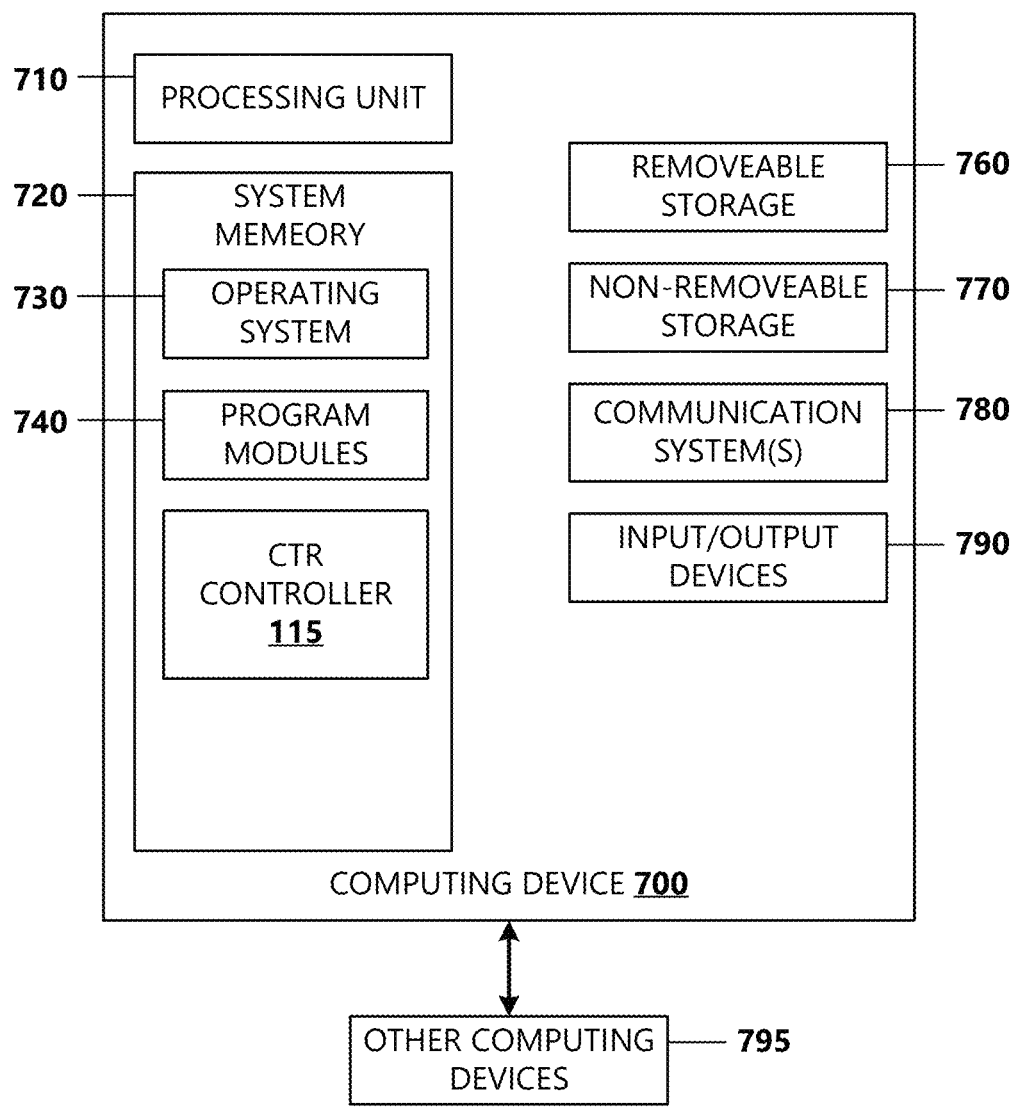
FIG. 7 is a block diagram illustrating example physical components of a computing device or system with which examples may be practiced.

FIG. 7 is a system diagram of a computing device 700 according to an example. As shown in FIG. 7, the physical components (e.g., hardware) of the computing device 700 are illustrated and these physical components may be used to practice the various aspects of the present disclosure.

The computing device 700 may include at least one processing unit 710 and a system memory 720. The system memory 720 may include, but is not limited to, volatile storage (e.g., random access memory), non-volatile storage (e.g., read-only memory), flash memory, or any combination of such memories. The system memory 720 may also include an operating system 730 that controls the operation of the computing device 700 and one or more program modules 740. The program modules 740 may be responsible for performing one more of the operations of the methods described above for providing robust network connectivity. A number of different program modules and data files may be stored in the system memory 720. While executing on the processing unit 710, the program modules 740 may perform the various processes described above. One example program module 740 includes sufficient computer-executable instructions for the CTR controller 115.

The computing device 700 may also have additional features or functionality. For example, the computing device 700 may include additional data storage devices (e.g., removable and/or non-removable storage devices) such as, for example, magnetic disks, optical disks, or tape. These additional storage devices are labeled as a removable storage 760 and a non-removable storage 770.

Examples of the disclosure may also be practiced in an electrical circuit comprising discrete electronic elements, packaged or integrated electronic chips containing logic gates, a circuit utilizing a microprocessor, or on a single chip containing electronic elements or microprocessors. For example, examples of the disclosure may be practiced via a system-on-a-chip (SOC) where each or many of the components illustrated in FIG. 7 may be integrated onto a single integrated circuit. Such a SOC device may include one or more processing units, graphics units, communications units, system virtualization units and various application functionality all of which are integrated (or "burned") onto the chip substrate as a single integrated circuit.

When operating via a SOC, the functionality, described herein, may be operated via application-specific logic integrated with other components of the computing device 700 on the single integrated circuit (chip). The disclosure may also be practiced using other technologies capable of performing logical operations such as, for example, AND, OR, and NOT, including but not limited to mechanical, optical, fluidic, and quantum technologies.

The computing device 700 may include one or more communication systems 780 that enable the computing device 700 to communicate with other computing devices 795 such as, for example, routing engines, gateways, signings systems and the like. Examples of communication systems 780 include, but are not limited to, wireless communications, wired communications, cellular communications, radio frequency (RF) transmitter, receiver, and/or transceiver circuitry, a Controller Area Network (CAN) bus, a universal serial bus (USB), parallel, serial ports, etc.

The computing device 700 may also have one or more input devices and/or one or more output devices shown as input/output devices 790. These input/output devices 790 may include a keyboard, a sound or voice input device, haptic devices, a touch, force and/or swipe input device, a display, speakers, etc. The aforementioned devices are examples and others may be used.

The term computer-readable media as used herein may include computer storage media. Computer storage media may include volatile and nonvolatile, removable and non-removable media implemented in any method or technology for storage of information, such as computer readable instructions, data structures, or program modules.

The system memory 720, the removable storage 760, and the non-removable storage 770 are all computer storage media examples (e.g., memory storage). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information, and which can be accessed by the computing device 700. Any such computer storage media may be part of the computing device 700. Computer storage media does not include a carrier wave or other propagated or modulated data signal.

Programming modules may include routines, programs, components, data structures, and other types of structures that may perform particular tasks or that may implement particular abstract data types. Moreover, aspects may be practiced with other computer system configurations, including hand-held devices, multiprocessor systems, microprocessor-based or programmable user electronics, minicomputers, mainframe computers, and the like. Aspects may also be practiced in distributed computing environments where tasks are performed by remote processing devices that are linked through a communications network. In a distributed computing environment, programming modules may be located in both local and remote memory storage devices.

Aspects may be implemented as a computer process (method), a computing system, or as an article of manufacture, such as a computer program product or computer-readable storage medium. The computer program product may be a computer storage medium readable by a computer system and encoding a computer program of instructions for executing a computer process. Accordingly, hardware or software (including firmware, resident software, microcode, etc.) may provide aspects discussed herein. Aspects may take the form of a computer program product on a computer-usable or computer-readable storage medium having computer-usable or computer-readable program code embodied in the medium for use by, or in connection with, an instruction execution system.

The description and illustration of one or more aspects provided in this application are intended to provide a thorough and complete disclosure of the full scope of the subject matter to those skilled in the art and are not intended to limit or restrict the scope of the invention as claimed in any way. The aspects, examples, and details provided in this application are considered sufficient to convey possession and enable those skilled in the art to practice the best mode of the claimed invention. Descriptions of structures, resources, operations, and acts considered well-known to those skilled in the art may be brief or omitted to avoid obscuring lesser known or unique aspects of the subject matter of this application. The claimed invention should not be construed as being limited to any embodiment, aspects, example, or detail provided in this application unless expressly stated herein. Regardless of whether shown or described collectively or separately, the various features (both structural and methodological) are intended to be selectively included or omitted to produce an embodiment with a particular set of features. Further, any or all of the functions and acts shown or described may be performed in any order or concurrently. Having been provided with the description and illustration of the present application, one skilled in the art may envision variations, modifications, and alternate embodiments falling within the spirit of the broader aspects of the general inventive concept provided in this application that do not depart from the broader scope of the present disclosure.

I claim:

1. A system, comprising:
   at least one processor; and
   a memory including instructions, which when executed by the processor, cause the system to:
   receive a first temperature measurement associated with a vehicle computer, wherein the vehicle computer has a target temperature range;
   determine whether the first temperature measurement is within an upper and a lower limit of the target temperature range;
   when a determination is made that the first temperature measurement is below the lower limit, cause a heating and cooling system of the vehicle to run a heating cycle, wherein:
   the heating and cooling system includes a computer heat exchanger in heat exchange communication with a phase change material (PCM) located in the vehicle computer; and
   running the heating cycle causes the computer heat exchanger to heat the PCM to and above a phase change temperature of the PCM; and
   when a determination is made that the first temperature measurement is above the upper limit, cause the heating and cooling system of the vehicle to run a cooling cycle, wherein running the cooling cycle causes the computer heat exchanger to cool the PCM to and below the phase change temperature of the PCM.

2. The system of claim 1, wherein:
   the vehicle computer is an autonomous driving computer comprising a temperature-sensitive processor; and
   the PCM is positioned between the temperature-sensitive processor and the computer heat exchanger.

3. The system of claim 1, wherein the instructions further cause the system to:
   receive a second temperature measurement associated with the vehicle computer;
   determine whether the second temperature measurement is within the upper and lower limits of the target temperature range; and
   when a determination is made that the second temperature measurement is within the upper and lower limits of the target temperature range, cause the heating and cooling system to end the heating or cooling cycle.

4. The system of claim 1, wherein the instructions further cause the system to:
   receive a third temperature measurement associated with the vehicle computer;
   determine the third temperature measurement is above the upper limit or below the lower limit of the target temperature range;
   cause the heating and cooling system of the vehicle to run one of the cooling cycle or heating cycle;
   receive a fourth temperature measurement associated with the vehicle computer;
   determine the fourth temperature measurement is within the upper limit and the lower limit of the target temperature range; and cause the heating and cooling system to end the one of the cooling cycle or heating cycle.

5. The system of claim 4, wherein an amount of time between the first temperature measurement and the third temperature measurement includes an amount of time the cooling or heating cycle is running the cooling or heating cycle and an additional amount of time where the PCM absorbs heat from or transfers heat to the vehicle computer.

6. The system of claim 1, wherein the first temperature measurement comprises a temperature measurement of the vehicle computer.

7. The system of claim 1, wherein the first temperature measurement comprises a temperature measurement of the PCM.

8. A vehicle, comprising:
   a vehicle computer, where the vehicle computer has a target temperature range;
   a heating and cooling system, comprising:
      a phase change material (PCM) in heat exchange communication with the vehicle computer and having a phase change temperature that is correlated to the target temperature range; and
      a computer heat exchanger in heat exchange communication with the PCM;
   at least one processor; and
   a memory including instructions, which when executed by the processor, cause the autonomous vehicle to:
      receive a first temperature measurement associated with the vehicle computer;
      determine whether the first temperature measurement is within an upper and a lower limit of the target temperature range;
      when a determination is made that the first temperature measurement is below the lower limit, cause a heating and cooling system to run a heating cycle, wherein running the heating cycle causes the computer heat exchanger to heat the PCM to and above the phase change temperature; and
      when a determination is made that the first temperature measurement is above the upper limit, cause the heating and cooling system of the vehicle to run a cooling cycle, wherein running the cooling cycle causes the computer heat exchanger to cool the PCM to and below the phase change temperature.

9. The vehicle of claim 8,
   the vehicle computer is an autonomous driving computer comprising a temperature-sensitive processor; and
   the PCM is positioned between the temperature-sensitive processor and the computer heat exchanger.

10. The vehicle of claim 8, wherein the instructions further cause the system to:
   receive a second temperature measurement associated with the vehicle computer;
   determine whether the second temperature measurement is within the upper and lower limits of the target temperature range; and
   when a determination is made that the second temperature measurement is within the upper and lower limits of the target temperature range, cause the heating and cooling system to end the heating or cooling cycle.

11. The vehicle of claim 8, wherein the instructions further cause the system to:
   receive a third temperature measurement associated with the vehicle computer;
   determine the third temperature measurement is above the upper limit or below the lower limit of the target temperature range;
   cause the heating and cooling system of the vehicle to run one of the cooling cycle or heating cycle;
   receive a fourth temperature measurement associated with the vehicle computer;
   determine the fourth temperature measurement is within the upper limit and the lower limit of the target temperature range; and
   cause the heating and cooling system to end the one of the cooling cycle or heating cycle.

12. The system of claim 11, wherein an amount of time between the first temperature measurement and the third temperature measurement includes an amount of time the cooling or heating cycle is running the cooling or heating cycle and an additional amount of time where the PCM absorbs heat from or transfers heat to the vehicle computer.

13. The vehicle of claim 8, wherein the first temperature measurement comprises a temperature measurement of the vehicle computer.

14. The vehicle of claim 8, wherein the first temperature measurement comprises a temperature measurement of the PCM.

* * * * *